(12) United States Patent
Hong et al.

(10) Patent No.: US 9,391,249 B2
(45) Date of Patent: Jul. 12, 2016

(54) LIGHT EMITTING DEVICE PACKAGE AND METHOD OF FABRICATING THE SAME

(71) Applicant: LG ELECTRONICS INC., Seoul (KR)

(72) Inventors: Munheon Hong, Seoul (KR); Sangcheon Kim, Seoul (KR); Chilkeun Park, Seoul (KR); Muntae Jung, Seoul (KR)

(73) Assignee: LG ELECTRONICS INC., Seoul (KR)

(*) Notice: Subject to any disclaimer, the term of this patent is extended or adjusted under 35 U.S.C. 154(b) by 0 days.

(21) Appl. No.: 14/741,183

(22) Filed: Jun. 16, 2015

(65) Prior Publication Data

US 2016/0104827 A1 Apr. 14, 2016

(30) Foreign Application Priority Data

Oct. 10, 2014 (KR) .................. 10-2014-0136889
Feb. 5, 2015 (KR) .................. 10-2015-0018134

(51) Int. Cl.
| H01L 33/00 | (2010.01) |
| H01L 33/58 | (2010.01) |
| G02F 1/1335 | (2006.01) |
| H01L 33/56 | (2010.01) |
| H01L 33/50 | (2010.01) |

(52) U.S. Cl.
CPC .......... *H01L 33/58* (2013.01); *G02F 1/133617* (2013.01); *H01L 33/507* (2013.01); *H01L 33/56* (2013.01); *G02F 2001/133614* (2013.01)

(58) Field of Classification Search
CPC ......... H01L 33/52; H01L 33/54; H01L 33/56; H01L 33/44

USPC ............................. 257/100; 313/504
See application file for complete search history.

(56) References Cited

U.S. PATENT DOCUMENTS

| 2006/0081862 | A1* | 4/2006 | Chua ................ B82Y 10/00 257/98 |
| 2008/0128735 | A1 | 6/2008 | Yoo et al. |
| 2008/0152933 | A1 | 6/2008 | Mizuno et al. |
| 2008/0180948 | A1 | 7/2008 | Yoon et al. |
| 2008/0308825 | A1 | 12/2008 | Chakraborty et al. |
| 2009/0134415 | A1 | 5/2009 | Morioka |
| 2011/0006316 | A1 | 1/2011 | Ing et al. |
| 2012/0087124 | A1 | 4/2012 | Ravillisetty et al. |

FOREIGN PATENT DOCUMENTS

| EP | 2 312 625 A2 | 4/2011 |
| EP | 2 492 577 A2 | 8/2012 |
| EP | 2 657 967 A2 | 10/2013 |
| JP | 2001-77433 A | 3/2001 |
| JP | 2003-324215 A | 11/2003 |
| JP | 2005-167079 A | 6/2005 |
| JP | 2006-80443 A | 3/2006 |

(Continued)

*Primary Examiner* — Thanh-Nhan P Nguyen
(74) *Attorney, Agent, or Firm* — Birch, Stewart, Kolasch & Birch, LLP

(57) ABSTRACT

A light emitting device package including a light emitting device; an encapsulant configured to cover the light emitting device; a first material mixed with the encapsulant to scatter light emitted from the light emitting device or convert a wavelength; and a second material mixed with the encapsulant, and disposed on a layer different from that of the first material in the encapsulant to scatter or wavelength-convert at least part of light scattered and wavelength-converted from the first material.

18 Claims, 10 Drawing Sheets

(56) References Cited

FOREIGN PATENT DOCUMENTS

| | | |
|---|---|---|
| JP | 2007-173373 A | 7/2007 |
| JP | 2008-156390 A | 7/2008 |
| JP | 2009-130301 A | 6/2009 |
| JP | 2012-256936 A | 12/2012 |
| JP | 2014-507755 A | 3/2014 |
| KR | 10-0930171 B1 | 12/2009 |
| KR | 10-2013-0053250 A | 5/2013 |
| KR | 10-2013-0084506 A | 7/2013 |

* cited by examiner

LIGHT EMITTING DEVICE PACKAGE AND METHOD OF FABRICATING THE SAME

CROSS-REFERENCE TO RELATED APPLICATIONS

This application claims the benefit of priorities of Korean Patent Application No. 10-2014-0136889, filed on Oct. 10, 2014, and 10-2015-0018134, filed on Feb. 5, 2015, which are herein expressly incorporated by reference in their entireties.

BACKGROUND OF THE INVENTION

1. Field of the Invention

The present disclosure relates to a light emitting device package containing a phosphor and a scattering agent and a method of fabricating the same.

2. Description of the Related Art

A backlight unit emits light on a rear surface of a liquid crystal panel so the user can view an image. In more detail, the liquid crystal panel does not emit light itself and thus light is uniformly emitted on the rear surface of the liquid crystal panel so the user can visually recognize an image displayed on the display unit.

The backlight unit uses a light source such as a light emitting device (light emitting diode (LED)) or a cold cathode fluorescent lamp (CCFL). The light emitting device has a lot of advantages compared to the CCFL because of lower power consumption, a long lifespan as well as easy fabrication of a small sized device. The light emitting device in the backlight unit is implemented in package form in which an encapsulant covers the light emitting device. Further, the light emitting device package may be a blue light emitting device package or a package containing a small amount of green phosphor or red phosphor.

In addition, efforts for improving the efficiency of the light emitting device itself as well as improving the light extraction efficiency of the light emitting device package have been performed. For example, in order to improve the light extraction efficiency in the light emitting device package, an uneven surface (forming a geometric structure or optical crystal structure) may be formed or a scattering agent/phosphor may be coated to enhance the light extraction efficiency. For a blue light emitting device package, the extraction efficiency has been improved by dispersing a scattering agent instead of containing no phosphor. However, such methods have a drawback of insufficient improvement in light extraction efficiency since photons generated from the light emitting device are unable to sufficiently escape from the encapsulant to an air space.

In general, a refraction index on each portion of the light emitting device package increases in the order of the light emitting device, the encapsulant, and the air space, and as a result, the package has a structure in which the escape of light or photons into the air space is not easy due to a total reflection phenomenon.

SUMMARY OF THE INVENTION

Accordingly, one aspect of the present invention is to address the above-noted and other problems with the related art.

Another aspect of the present disclosure is to enhance the light extraction efficiency in a display apparatus compared to the related art.

In still another aspect, the present disclosure enhances light extraction efficiency in a light emitting device package into which a small amount of phosphor is infiltrated or not infiltrated in a high color reproduction backlight unit.

Still another aspect of the present disclosure is to enhance light extraction efficiency in a monochromatic wavelength light emitting device package in which only a scattering agent is used with no phosphor or no particles.

To achieve these and other advantages and in accordance with the purpose of the present invention, as embodied and broadly described herein, the present invention provides in one aspect a light emitting device package including a light emitting device; an encapsulant configured to cover the light emitting device; a first material mixed with the encapsulant to scatter light emitted from the light emitting device or convert a wavelength; and a second material mixed with the encapsulant, and disposed on a layer different from that of the first material in the encapsulant to scatter or wavelength-convert at least part of light scattered and wavelength-converted from the first material. The present invention also provides a corresponding display apparatus including a plurality of the light emitting device packages and a method of manufacturing the same.

Further scope of applicability of the present invention will become apparent from the detailed description given hereinafter. However, it should be understood that the detailed description and specific examples, while indicating preferred embodiments of the invention, are given by illustration only, since various changes and modifications within the spirit and scope of the invention will become apparent to those skilled in the art from this detailed description.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Figure 1:
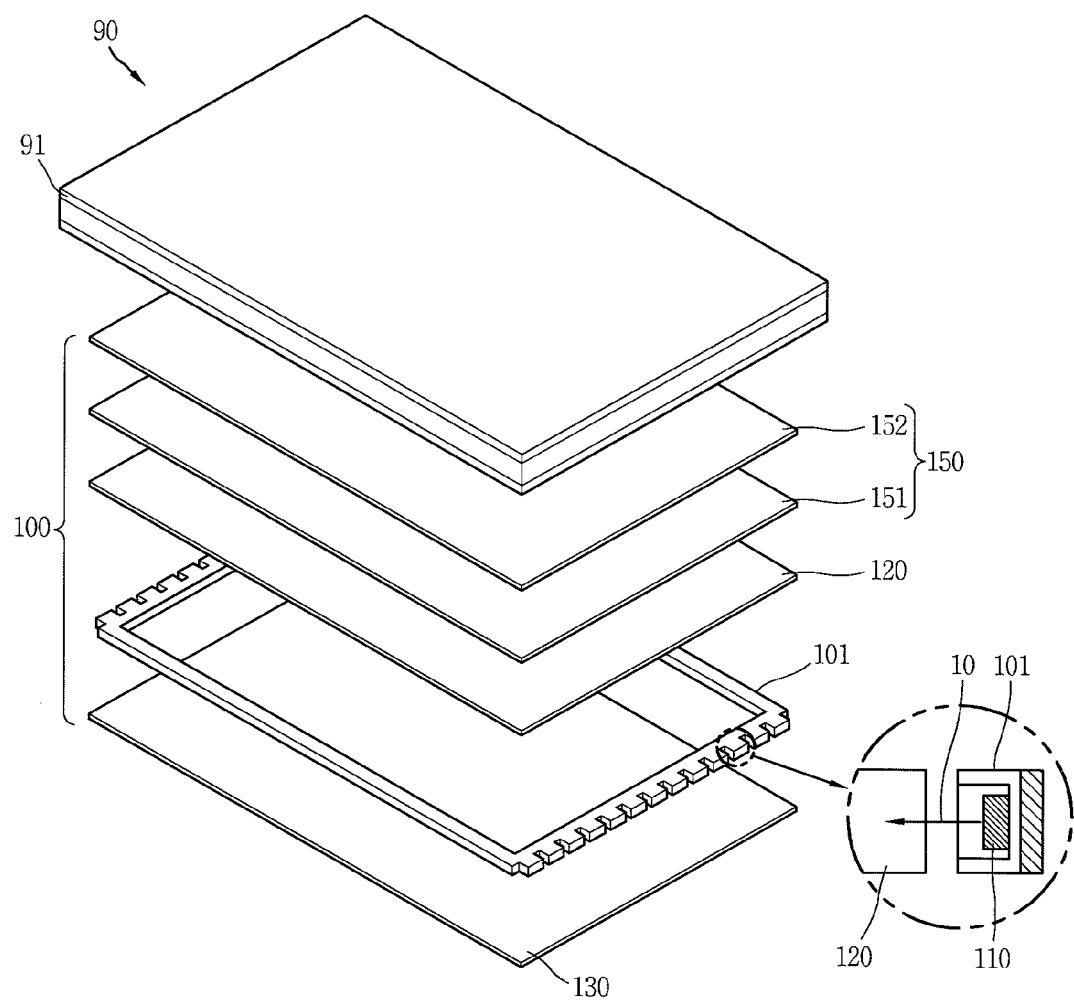
FIG. 1 is a conceptual view illustrating a display apparatus according to an embodiment of the present disclosure.

Hereinafter, a light emitting device package and a fabrication method thereof according to an embodiment of the present disclosure will be described in more detail with reference to the accompanying drawings. Even in different embodiments according to the present disclosure, the same or similar reference numerals are designated to the same or similar configurations, and the description thereof will be substituted by the earlier description. Unless clearly used otherwise, expressions in the singular number used in the present disclosure may include a plural meaning. A suffix "module" or "unit" used for constituent elements used in the present disclosure is merely intended for easy description of the specification, and the suffix itself does not give any special meaning or function.

Hereinafter, a display apparatus will be first described, and then a light emitting device package applied to a backlight unit of the display apparatus will be described to clearly describe the present disclosure in detail. However, the use of a light emitting device of the present disclosure such as applying light emitting device packages to a display apparatus for forming unit pixels is not limited to the backlight unit.

FIG. 1 is a conceptual view illustrating a display apparatus 90 according to an embodiment of the present disclosure. The display apparatus 90 is configured to display (output) visual information. In FIG. 1, the display apparatus 90 includes a liquid crystal panel 91 and a backlight unit 100. FIG. 1 illustrates the display apparatus 90 using a light emitting diode (LED) as a light source of the backlight unit 100.

The liquid crystal panel 91 may be formed by the deposition of a first polarizer, liquid crystal cells and a second polarizer. Further, the liquid crystal panel 91 uses a property in which molecular alignment is varied when a voltage is applied thereto. Thus, the liquid crystal panel 91 causes a change of liquid crystal transmittance according to a voltage applied thereto, and converts various electrical information generated from various devices into visual information. The liquid crystal panel 91 also receives light from the backlight unit 100 since it does not emit light itself.

In addition, the backlight unit 100 emits light from a rear side of the liquid crystal panel 91 such that an image of the display apparatus 90 can be seen. The backlight unit 100 may include a light source, a light guide plate 120, a reflecting plate 130, and an optical sheet 150. Further, the light source may include a light emitting device 111 (refer to FIG. 2) emitting light with a current applied thereto. The light emitting device may be a light emitting diode, for example, and be implemented in the form of a light emitting device package 110 covered by an encapsulant.

In this instance, a plurality of light emitting device packages 110 may be disposed within a housing 101, and the housing 101 may be formed to surround an edge of the light guide plate 120. However, the arrangement of the light emitting device 111 is not limited to the drawing illustrated in FIG. 1. In addition, the backlight unit 100 may be divided into a direct type and an edge type according to the arrangement of the light source.

Further, the light guide plate 120 guides light illuminated from the light emitting device 111. The light guide plate 120 may be disposed in a region defined by the housing 101 to receive light from the light emitting device 111. The light guide plate 120 can also perform the role of uniformly transferring light emitted from the light source to the entire surface of the liquid crystal panel 91.

In addition, the reflecting plate 130 is disposed below the light guide plate 120 to re-enter light loss released without being transferred from the light guide plate 120 to the liquid crystal panel 91. Also, the reflecting plate 130 is disposed at the rear side of the light guide plate 120 based on the user's viewpoint with respect to the display apparatus 90.

Further, the optical sheet 150 may include various sheets used to enhance the optical characteristics of the backlight unit 100. In FIG. 1, the optical sheet 150 includes at least one of a diffusion sheet 151, a prism sheet 152 and a brightness enhancement film, for example. The diffusion sheet 151 converts light emitted from the light guide plate 120 into surface light having a uniform brightness to uniformly transfer light to the liquid crystal panel 91. A diffusion plate may also be used for a direct type backlight unit 100.

In addition, the prism sheet 152 converts side light into front light to collect emitted light to enhance the brightness of light. The brightness enhancement film (BEF) or dual brightness enhancement film (DBEF) is configured to enhance the brightness of light emitted to the liquid crystal display apparatus. The efficiency of light provided from a light source decreases while passing through the light guide plate 120 and diffusion sheet 151. The brightness enhancement film transmits P-waves perpendicular to a place and reflects S-waves in parallel to the plane. Since S-waves in parallel to the plane are reflected and only light that has been converted into P-waves passes through the film, the brightness enhancement film enhances the brightness through the collection of light.

In addition, the backlight unit 100 can provide white light or monochromatic light to the liquid crystal panel 91, and thus the light emitting device package may be a white light emitting device package or monochromatic light emitting device package (for example, blue light emitting device package). According to the present disclosure, a novel mechanism is provided to enhance the light extraction efficiency in the white light emitting device package or monochromatic light emitting device package.

Figure 2:
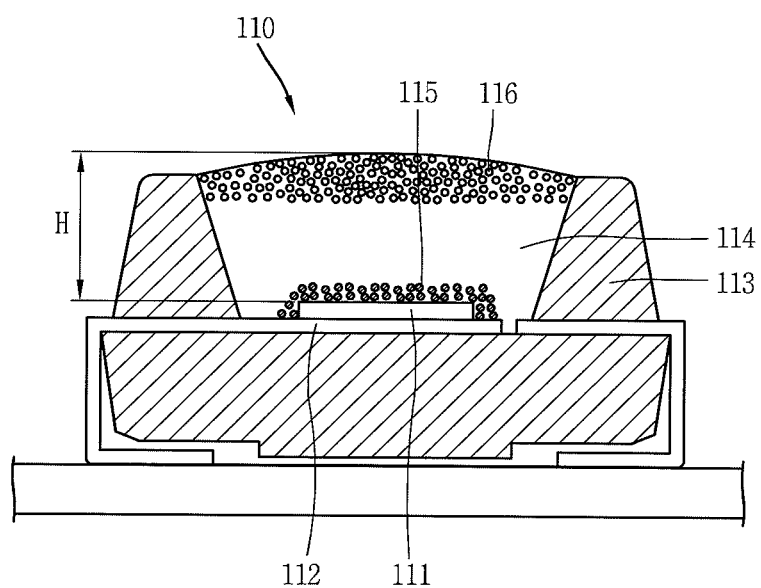
FIG. 2 is a conceptual view illustrating a light emitting device package in FIG. 1.
Figure 3A:
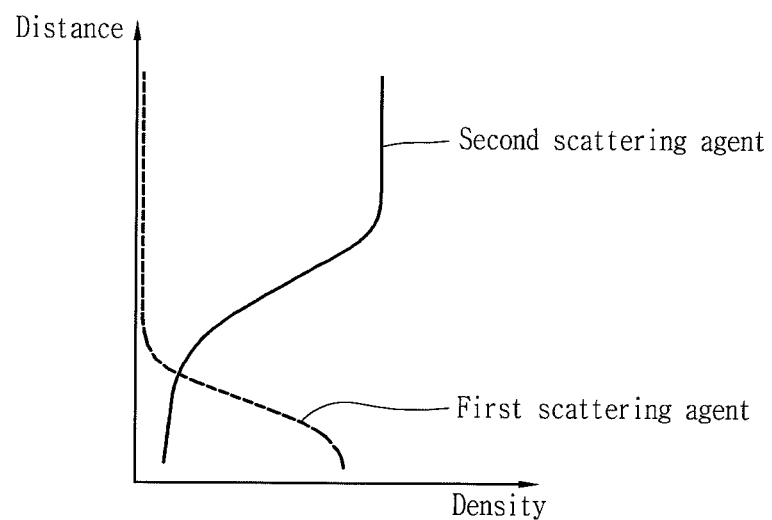
FIGS. 3A and 3B are conceptual views illustrating a vertical distribution and a horizontal distribution of a scattering agent on a light emitting device package in FIG. 2.
Figure 3B:
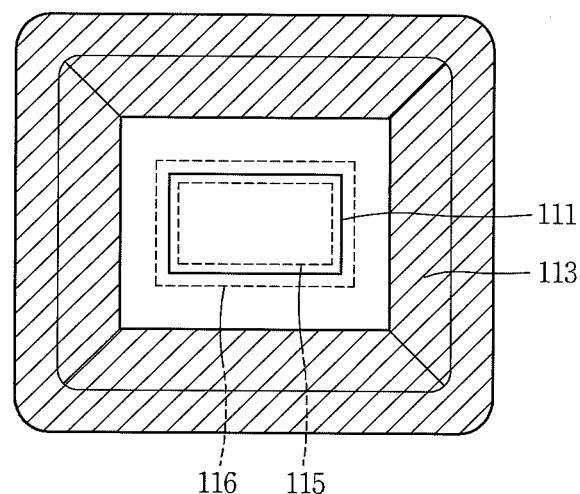

In particular, FIG. 2 is a conceptual view illustrating a light emitting device package in FIG. 1, and FIGS. 3A and 3B are conceptual views illustrating a vertical distribution and a horizontal distribution of a scattering agent on a light emitting device package in FIG. 2.

As illustrated in FIG. 2, the light emitting device package 110 may include a light emitting device 111, an electrode 112 electrically connected to the light emitting device 111, a body 113 configured to surround the electrode 112, and an encapsulant 114 configured to cover the light emitting device 111. The body 113 may be formed of at least one of a resin material such as polyphthalamide (PPA), and silicon (Si), aluminum (Al), aluminum nitride (AlN), a liquid crystal polymer (PSG, photo sensitive glass), polyamide 9T (PA9T), syndiotactic polystyrene (SPS), a metal material, sapphire ($Al_2O_3$), beryllium oxide (BeO), a printed circuit board (PCB), and ceramic. The body 113 may also be formed with an injection molding, an etching process, or the like, but the present disclosure is not limited to this.

The body 113 may form a cavity in which the light emitting device 111 is disposed. The shape of a cavity formed by the body 113, which is seen from the top, may be a circular, polygonal or elliptical shape, and an edge thereof may have a curved shape, but the present disclosure is not limited to this.

The electrode 112 is disposed in one region of the body 113. For example, the body 113 may be formed to surround one region of the electrode 112 to fix the electrode 112. Further, the electrode 112 is electrically connected to the light emitting device 111. Two electrodes 112 having different electrical polarities may also be provided. In particular, the two electrodes 112 having different electrical polarities can be connected to two electrodes of the light emitting device 111, respectively, to supply power to the light emitting device 111.

In addition, the light emitting device 111 is formed to emit light, and disposed in a cavity formed by the body 113. Further, the light emitting device 111 may be a light emitting diode (LED). The light emitting device 111 may also be at least one of a horizontal type in which the electrical terminals are formed on an upper surface, a vertical type in which the electrical terminals are formed on an upper and a lower surface, and a flip chip.

Further, the light emitting device 111 includes a first semiconductor layer, an active layer and a second semiconductor layer sequentially deposited, and either one of the first and second semiconductor layers may be implemented with a p-type semiconductor layer doped with a p-type dopant, and the other one may be an n-type semiconductor layer doped with an n-type dopant. The light emitting device 111 may also be a blue semiconductor light emitting device mainly used for the backlight unit.

In addition, the encapsulant 114 is filled into the cavity, and covers and protects the light emitting device 111. In this instance, the encapsulant 114 may include a scattering agent or phosphor. The encapsulant 114 may also include a light transmitting resin such as silicon, epoxy, and other resin materials, and the light transmitting resin is formed to cover the light emitting device 111. The encapsulant 114 may be formed by a method of filling the light transmitting resin into the cavity, and then curing it using ultraviolet rays and heat.

Referring to FIG. 2, a first material 115 and a second material 116 are mixed in the encapsulant 114, and the first material 115 and second material 116 are disposed on different layers from each other in the encapsulant 114. Further, the first material 115 scatters light emitted from the light emitting device 111 or converts a wavelength thereof. In this instance, the first material 115 may be a scattering agent for scattering light or a phosphor for converting a wavelength thereof. Hereinafter, the description of the first material 115 illustrates a scattering agent, but it may be replaced with a yellow phosphor for exciting light emitted from a blue semiconductor light emitting device to output white light.

The scattering agent may be formed of at least one selected from a group consisting of silicone, alumina, titanium dioxide ($TiO_2$), zirconia ($ZrO_2$), barium sulfate, zinc oxide (ZnO), poly(methylmethacrylate) (PMMA) and benzoguanamine-based polymer. Alternatively, the scattering agent may be formed of at least one selected from a group consisting of silica, alumina, titanium dioxide ($TiO_2$), zirconia ($ZrO_2$), barium sulfate and zinc oxide (ZnO).

According to FIG. 2, the first material 115 is disposed closer or more adjacent to the light emitting device 111 than the second material 116. Thus, the light extraction efficiency from the light emitting device 111 to a light transmitting resin is enhanced. More specifically, the first material 115 may be disposed adjacent to the light emitting device 111 to reduce a light reflection and absorption phenomenon caused by a total reflection phenomenon due to different refractive indices at an interface.

Referring to FIG. 3A, the first material 115 is disposed on a specific layer (hereinafter, referred to as a "first layer") including a surface of the light emitting device 111 as a boundary. The first material 115 may be distributed under 15% of the distance (H) from the light emitting device 111 to the interface. Furthermore, the first material 115 may subside to the light emitting device to be uniformly distributed on a surface of the light emitting device 111.

Further, the second material 116 is disposed adjacent to an interface between the encapsulant and external air space. In other words, the second material 116 is disposed on a specific layer (hereinafter, referred to as a "second layer") including the interface as a boundary. For example, the second material may be distributed above 60% of the distance (H) from the light emitting device to the interface. In addition, the second material 116 is disposed adjacent to an interface between the encapsulant 114 and external air space to scatter at least part of light that has been scattered or a wavelength of which has been converted in the second material 116. Furthermore, the second material 116 may scatter at least part of light that has been emitted from the light emitting device 111 but not scattered in the first material 115 or convert a wavelength thereof. Thus, the second material 116 may float up to an interface between the encapsulant 114 and external air space to be uniformly distributed on a plane projecting the interface.

In this instance, the second material 116 may be in a larger area than the first material. Referring to FIG. 3B, the first material 115 can overlap an area of above 90% of the light emitting device 111, and the second material 116 can completely overlap with an area of the light emitting device 111. In particular, for a blue light emitting device package, the first material 115 can completely cover the light emitting device or cover above an area of above 90% of the light emitting device. In another example, the first material 115 and second material 116 can overlap with an area of above 90% of the light emitting device, and the second material 116 can have a larger distribution area than the first material 115.

Furthermore, the second material 116 may be a scattering agent for scattering light or a phosphor for converting a wavelength thereof. Hereinafter, the description of the second material 116 illustrates a scattering agent, but it may be replaced with a yellow phosphor for exciting light emitted from a blue semiconductor light emitting device to output white light. At this time, the type of scattering agent provided in the foregoing first material may be applicable to the type of the scattering agent. Hereinafter, a scattering agent of the first material is referred to as a first scattering agent, and a scattering agent of the second material is referred to as a second scattering agent.

The first layer is deposited on a surface of the light emitting device, and the second layer is disposed on a surface of the encapsulant, and thus an intermediate layer in which only the light transmitting resin is disposed may be formed between the first scattering agent and the second scattering agent. The intermediate layer may be formed within a range of 15 to 60% of the distance (H) from the light emitting device to the interface. Thus, the light emitting device package can have a varying distribution at a specific portion within the encapsulant. For example, the light emitting device package can decrease the distribution of the first scattering agent as being closer to a surface of the encapsulant from the light emitting device package and increase the distribution of the second scattering agent as being closer to a surface of the encapsulant from the light emitting device package.

The size of the first and the second scattering agent may be 10 to 50 nanometers based on the diameter thereof, and in this instance, the first and the second scattering agent (or the first and the second material) may be formed to have different specific gravities to allow the first and the second scattering agent to form different layers from each other. According to the present embodiment, the first and the second scattering agent can have different materials with the same size. Through this, the first and the second scattering agent may have different specific gravities, but the present disclosure is not limited to this. For example, since the first and the second scattering agent can be formed of different materials, it is possible to implement different specific gravities even when their sizes are different from each other.

Further, the first scattering agent is formed to have a specific gravity larger than that of the light transmitting resin, and the second scattering agent is formed to have a specific gravity smaller than that of the light transmitting resin. Thus, the first scattering agent can subside or settle to a surface of the light emitting device, and the second scattering agent can float up to a surface of the light transmitting resin. Thus, it is possible to implement a light emitting device package in which a first layer on which the first scattering agent is mixed with a light transmitting resin and a second layer on which the second scattering agent is mixed with the light transmitting resin are sequentially deposited. According to the foregoing structure, it is possible to solve a problem that light is confined or absorbed within an encapsulant and then turned into heat to reduce the light extraction efficiency in a light emitting device package.

Further, scattering agents in a light emitting device package according to embodiments of the present disclosure can be modified in various forms. Hereinafter, such modified examples will be described with reference to FIGS. 4A, 4B and 4C. Furthermore, according to modified examples or embodiments which will be described below, the same or similar reference numerals will be designated to the same or similar configurations, and the description thereof will be substituted by the earlier description.

Figure 4A:
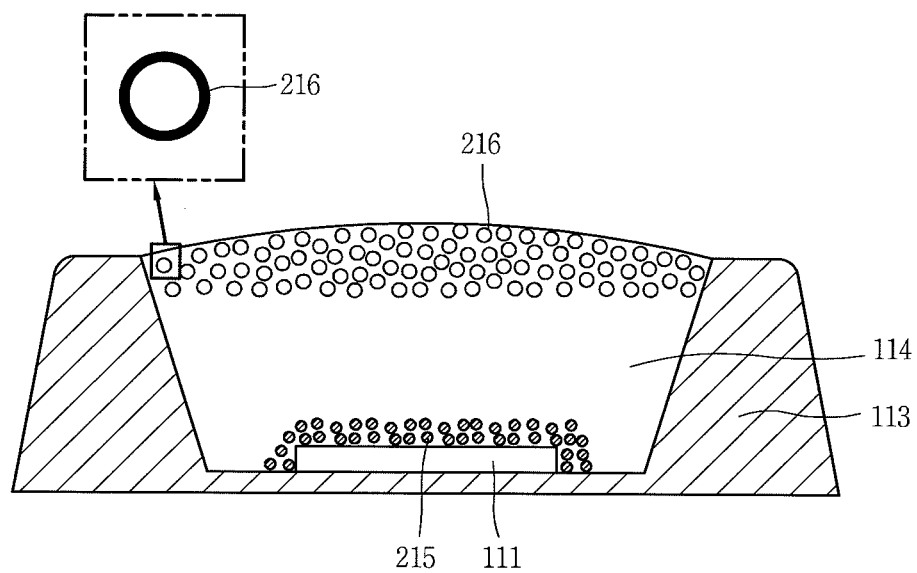
FIGS. 4A, 4B and 4C are conceptual views illustrating modified examples of a scattering agent in a light emitting device package according to an embodiment of the present disclosure.
Figure 4B:
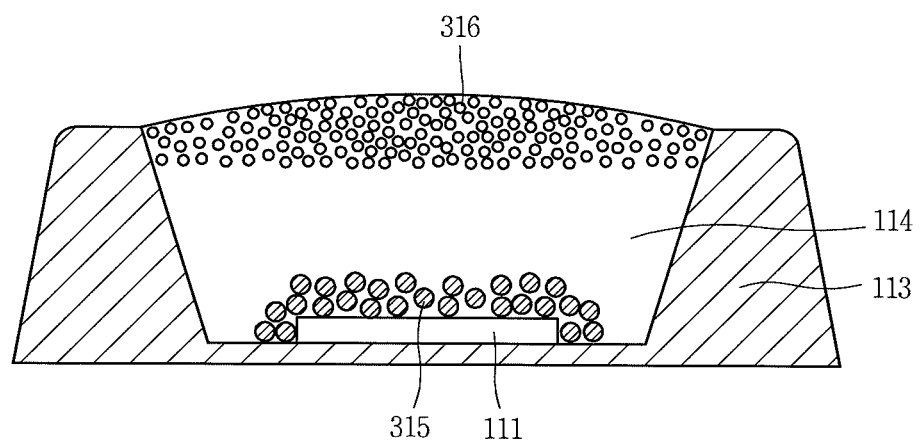
Figure 4C:
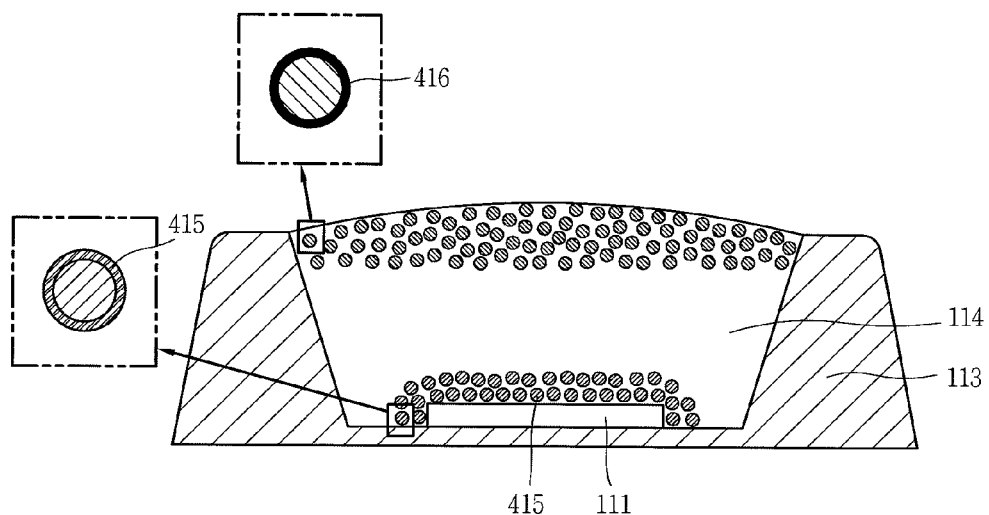

In particular, FIGS. 4A, 4B and 4C are conceptual views illustrating modified examples of a scattering agent in a light emitting device package according to an embodiment of the present disclosure. As shown, light emitting device packages may include a light emitting device 111 for emitting light, an electrode electrically connected to the light emitting device 111, a body 113 configured to surround the electrode, and an encapsulant 114 configured to cover the light emitting device 111.

Further, a first and a second scattering agent (or a first material and a second material) can be formed to have different specific gravities such that the first and the second scattering agent form different layers in the encapsulant 114. First, referring to FIG. 4A, the first scattering agent 215 and second scattering agent 216 may have the same material, but the first scattering agent 215 may form solid particles (in a filled inside shape) and the second scattering agent 216 may form hollow particles (in a vacant inside shape). For example, the first and the second scattering agent 215 and 216 may be made of a material such as $SiO_2$ or $Al_2O_3$, and the diameter of the hollows may be several nanometers to several tens of nanometers.

According to the present embodiment, the first scattering agent 215 is solid $SiO_2$ spheres, and the second scattering agent 216 is hollow $SiO_2$ shells, and thus the second scattering agent 216 has a specific gravity larger than that of the first scattering agent 215. Due to the difference between the specific gravities, the first and the second scattering agent 215 and 216 can form different layers in the encapsulant 114. More specifically, the solid first scattering agent 215 subsides or settles to the light emitting device 111 to be uniformly distributed on a surface of the light emitting device 111, and the hollow second scattering agent 216 floats up to an interface between the encapsulant 114 and external air space to be uniformly distributed on the interface.

In another example, the distribution of the second scattering agent 216 can be adjusted by controlling the size of the hollows. More specifically, as the size of hollows in the second scattering agent 216 increases, they are disposed closer or more adjacent to the interface between the encapsulant 114 and the external air space.

Further, a difference between the specific gravities in the first and the second scattering agent can be adjusted according to the size variation of the scattering agent. In particular, FIG. 4B illustrates a structure in which scattering agents move up or down due to a difference between specific gravities according to the size of scattering agents. For example, the first and the second scattering agent 315 and 316 may be formed to have the same material but with different sizes.

In addition, the relative size of the scattering agents may be 5 to 70 times, and the first and the second scattering agent 315 and 316 may form different layers due to the relative size. More specifically, the first scattering agent 315 with a relatively larger size subsides or settles to the light emitting device 111 to be uniformly distributed on a surface of the light emitting device 111, and the second scattering agent 316 with a relatively smaller size floats up to an interface between the encapsulant 114 and external air space to be uniformly distributed on the interface.

In the above description, a mechanism of allowing the first and the second scattering agent to form different layers due to a difference between specific gravities has been illustrated, but such a mechanism may be also implemented by scattering agents with different structures. For example, the first scattering agent and the second scattering agent may be surface-treated to have different properties.

Referring to FIG. 4C, the first scattering agent 415 can be coated with a coagulant to cohere with one another, and the second scattering agent 416 can be coated with a dispersant to disperse from one another. In this instance, the first and the second scattering agent 415 and 416 have particles with the same material and similar size, but a spatial distribution thereof is adjusted through a surface treatment.

For example, the first scattering agent 415 may be formed of a material such as $SiO_2$, $TiO_2$, $Al_2O_3$, and the like, and the surface of the first scattering agent 415 may be coated with a coagulant to efficiently cohere with one another within the encapsulant. Furthermore, the second scattering agent 416 may be formed of a material such as $SiO_2$, $TiO_2$, $Al_2O_3$, and the like, and the surface of the second scattering agent 416 may be coated (or chemically combined) with a surfactant and surface-treated to efficiently disperse from one another. Further, the first scattering agents 415 adhere to one another to subside or settle, and the second scattering agents 416 disperse from one another to float up, and thus the first and the second scattering agent 415 and 416 form different layers. More specifically, the cohered first scattering agents 415 subside to the light emitting device 111 to be uniformly distributed on a surface of the light emitting device 111, and the dispersed second scattering agents 416 float up to an interface between the encapsulant 114 and external air space to be uniformly distributed on the interface.

In the above description, a mechanism of allowing scattering agents to form a multi-layer in a light emitting device package has been described. The foregoing light emitting device packages can be fabricated with a novel type of fabrication method, which will be described with reference to FIG. 5.

Figure 5:
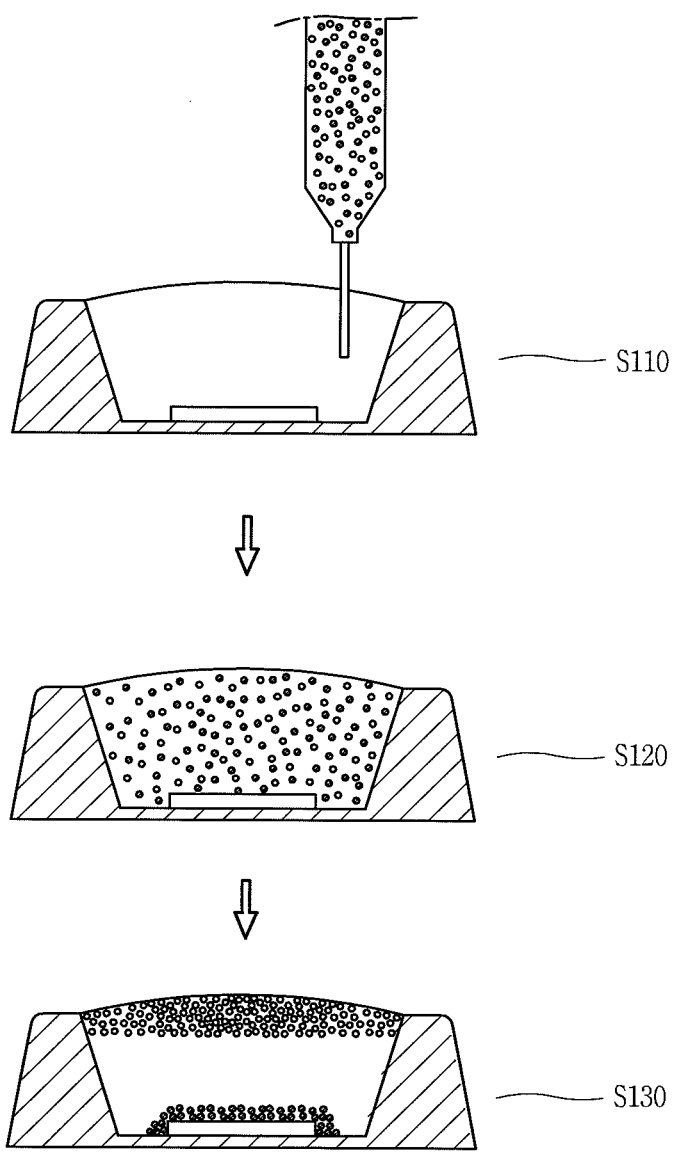
FIG. 5 is a flow chart illustrating a method of fabricating a light emitting device package in FIG. 2.

In particular, FIG. 5 is a flow chart illustrating a method of fabricating a light emitting device package in FIG. 2. Referring to FIG. 5, a first and a second material having different specific gravities are mixed in an encapsulant (S110). As discussed above, the first and the second material scatter light emitted from the light emitting device or convert a wavelength thereof. For example, the first and the second material may be a scattering agent for scattering light or a phosphor for converting a wavelength thereof. Similarly to the foregoing structure of a light emitting device package, hereinafter, the description of the first and the second material illustrates a scattering agent, but they may be replaced with a phosphor.

In addition, the first scattering agent is formed to have a specific gravity larger than the light transmitting resin, and the second scattering agent is formed to have a specific gravity smaller than the light transmitting resin. A difference between the specific gravities may be implemented by the foregoing use of different materials, solid and hollow structures, a difference between sizes, or the like. However, the present disclosure is not limited to this, and as shown in an example described with reference to FIG. 4C, a first and a second scattering agent with different surface treatments may be mixed in an encapsulant.

Next, the encapsulant mixed with the first and the second scattering agent is coated to cover a light emitting device (S120). In other words, the encapsulant is filled with the light emitting device disposed in a cavity of the light emitting device package, and the first and the second scattering agent are mixed in the encapsulant. In another example, an encapsulant mixed with the first and the second scattering agent and an encapsulant not mixed with the scattering agents may be sequentially filled into a cavity of the light emitting device package.

Then, the first and the second scattering agent are disposed on different layers from each other due to the different specific gravities (S130). For example, as time passes, the first and the second scattering agent are spatially separated according to a difference between specific gravities of the first and the second scattering agent. More specifically, the first scattering agent with a larger specific gravity is distributed on or near a surface of the light emitting device and contributes to extract blue light from an inside of the light emitting device. The second scattering agent with a smaller specific gravity floats up to an interface between the light transmitting resin and the air space, thereby providing an effect of reducing an effective refractive index during the curing of the light transmitting resin. Thus, blue light (or monochromatic light or white light) can be easily extracted into air from the light transmitting resin (encapsulant).

Further, a yellow phosphor may be included in the light transmitting resin. In this instance, white light can be output from the light emitting device package, wherein a difference between effective refractive indices can be reduced when blue light generated from the light emitting device due to a second scattering agent is subject to an interaction with the yellow phosphor and then escaped into the air space through the light transmitting resin. Such a structure may cause scattering to reduce a ratio of incident light at a total reflection angle to help more light escape into the air space. Furthermore, the light transmitting resin may include a red phosphor or green phosphor.

In another example, the scattering agents may be separated from one another to be injected into the encapsulant. In this instance, the light emitting device package may be implemented with a novel structure. Hereinafter, such a structure and a fabrication method thereof will be described with reference to FIGS. 6 through 8.

Figure 6:
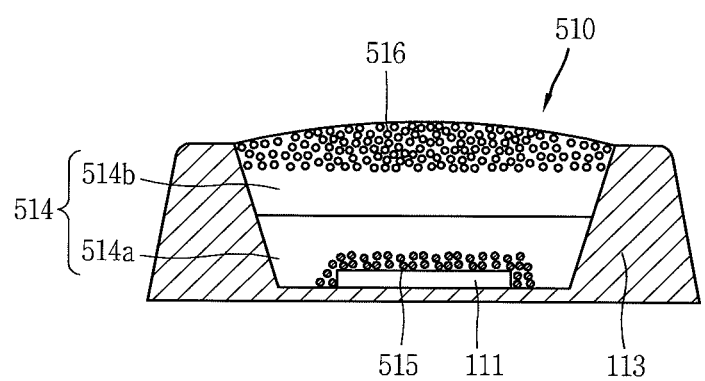
FIG. 6 is a conceptual view illustrating another embodiment of a light emitting device package according to an embodiment of the present disclosure.
Figure 7:
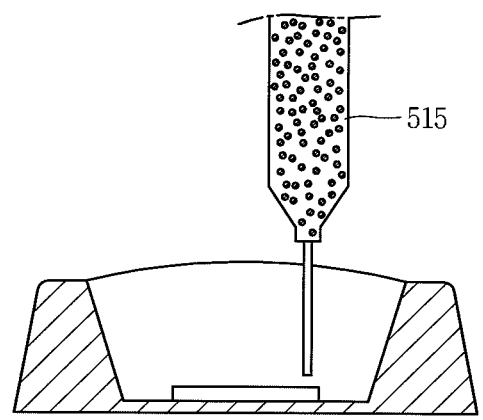
FIGS. 7 and 8 are flow charts respectively illustrating a method of fabricating a light emitting device package in FIG. 6.
Figure 7:
Figure 7:
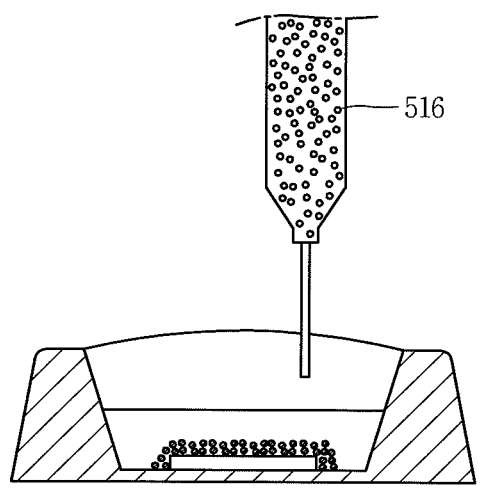
Figure 7:
Figure 7:
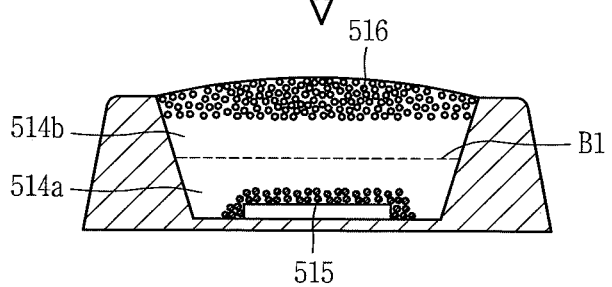
Figure 8:
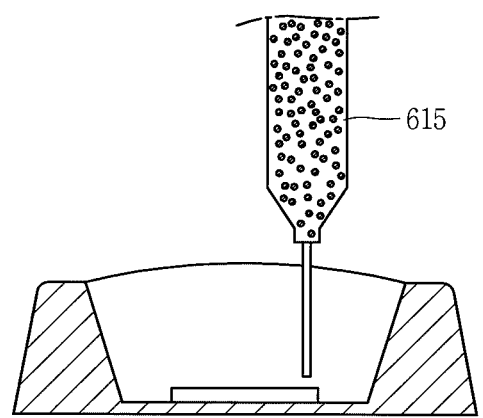
Figure 8:
Figure 8:
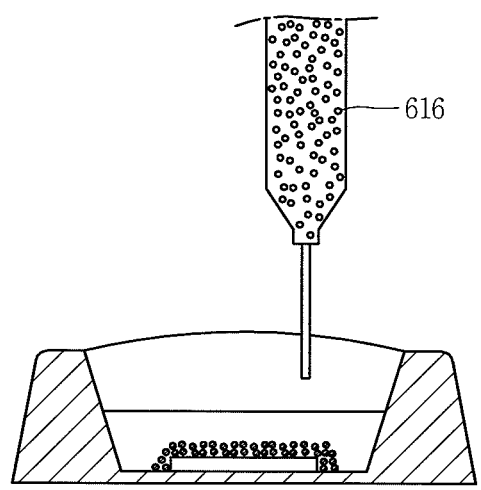
Figure 8:
Figure 8:
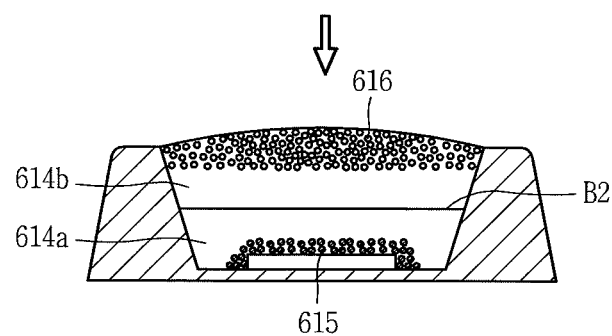

In particular, FIG. 6 is a conceptual view illustrating another embodiment of a light emitting device package according to an embodiment of the present disclosure, and FIGS. 7 and 8 are flow charts respectively illustrating a method of fabricating a light emitting device package in FIG. 6. According to FIG. 6, the light emitting device package 510 includes a light emitting device 111 configured to emit light, an electrode electrically connected to the light emitting device 111, and a body 113 configured to surround the electrode. The structure of the electrode and body 113 are the same as that of the light emitting device package described above with reference to FIG. 2, and the description thereof can be substituted by the earlier description.

A shown, an encapsulant 514 covering the light emitting device 111 may include a first light transmitting resin 514*a* in which either one of a first and a second material is disposed and a second light transmitting resin 514*b* in which the other one is disposed. The first and the second material scatter light emitted from the light emitting device or convert a wavelength thereof. In this instance, the first and the second material may be a scattering agent for scattering light or a phosphor for converting a wavelength thereof. Similarly to the foregoing embodiment, the present embodiment illustrates the first and the second material corresponding to a first scattering agent 515 and a second scattering agent 516, respectively, but they may be replaced with phosphors.

More specifically, the first light transmitting resin 514*a* is configured to cover the light emitting device 111, and the second light transmitting resin 514*b* is formed to cover the first light transmitting resin 514*a*. In other words, the encapsulant is configured with a structure in which resins form a plurality of layers. In this instance, the first light transmitting resin 514*a* and second light transmitting resin 514*b* may be formed of the same material, but provide different filling sequences as illustrated in FIG. 7.

The first scattering agent 515 is formed to have a specific gravity larger than that of the light transmitting resins 514*a* and 514*b* and the second scattering agent 516 is formed to have a specific gravity smaller than that of the light transmitting resins 514*a* and 514*b*. A difference between the specific gravities may be implemented by the foregoing use of different materials, solid and hollow structures, a difference between sizes, or the like. However, the present disclosure is not limited to this, and as shown in an example described with reference to FIG. 4C, a first and a second scattering agent may be surface-treated with different shapes.

FIG. 7 may be configured with a fabrication method of separately mixing two scattering agents with the same resin, respectively, and coating them on a package using two sequential coating processes or with a time difference to concentrate scattering agents for each layer. For example, the first scattering agent 515 is mixed with the first light transmitting resin 514*a*, and the second scattering agent 516 is mixed with the second light transmitting resin 514*b*. The first light transmitting resin 514*a* mixed with the first scattering agent 515 is filled into a cavity of the light emitting device package to cover the light emitting device 111, and then the first scattering agent 515 subsides to cure the first light transmitting resin 514*a*.

Next, the second light transmitting resin 514*b* mixed with the second scattering agent 516 is filled into a cavity of the light emitting device package to cover the first light transmitting resin 514*a*, and then the second scattering agent 516 floats up to cure the second light transmitting resin 514*b*. The light transmitting resins 514*a*, 514*b* are the same material, and thus the first light transmitting resin 514*a* and second light transmitting resin 514*b* may be formed into an integral body with no boundary (B1) therebetween.

In another example, referring to FIG. 8, the first light transmitting resin 614*a* and second light transmitting resin 614*b* may be formed of different materials, and may have a different filling sequence. In other words, a package may be fabricated by scattering two scattering agents into different resins, respectively, and independently coating them using independent or sequential processes. Further, the first scattering agent 615 is mixed with the first light transmitting resin 614*a*, and the second scattering agent 616 is mixed with the second light transmitting resin 614*b* having a different material from that of the first light transmitting resin 614*a*.

For example, the first light transmitting resin 614*a* mixed with the first scattering agent 615 is filled into a cavity of the light emitting device package to cover the light emitting device 111, and then the first scattering agent 615 subsides to cure the first light transmitting resin 614a. Next, the second light transmitting resin 614b mixed with the second scattering agent 616 is filled into a cavity of the light emitting device package to cover the first light transmitting resin 614a, and then the second scattering agent 616 floats up to cure the second light transmitting resin 614b. The light transmitting resins 614a and 614b are different materials, and thus a boundary (B2) can be formed between the first light transmitting resin 614a and second light transmitting resin 614b.

According to the above light emitting device package of the present disclosure, the light extraction efficiency of a blue light emitting device or a monochromatic light source package using a monochromatic color is enhanced. Furthermore, the wavelength bandwidth of the output light source can be extended to UV, visible light and IR rays. In this instance, an average diameter of the scattering agent can be determined by a wavelength bandwidth thereof.

In addition, as described above, a high-efficiency light source for a high color reproduction backlight unit can be implemented using a light emitting device package with an excellent light extraction efficiency. Moreover, a combination of a monochromatic light emitting device package and a phosphor film can be used for a high color reproduction backlight unit. Thus, according to a package structure of an embodiment of the present disclosure, the enhancement of the brightness and energy efficiency occurs due to an enhanced luminous efficiency of the monochromatic light emitting device.

Further, the structure of a light emitting device package according to an embodiment of the present disclosure may be implemented in another form. Hereinafter, such an embodiment will be described with reference to FIGS. 9A and 9B. In particular, FIGS. 9A and 9B are conceptual views respectively illustrating another embodiment of a light emitting device package according to an embodiment of the present disclosure.

According to the present example, a light emitting device package 710 includes a light emitting device 711 configured to emit light, an electrode 712 electrically connected to the light emitting device 711, a body 713 configured to surround the electrode 712, and an encapsulant 714 configured to cover the light emitting device 711. The description described above with reference to FIG. 2 is applicable to the description of the light emitting device 711, electrode 712, body 713 and encapsulant 714.

Figure 9A:
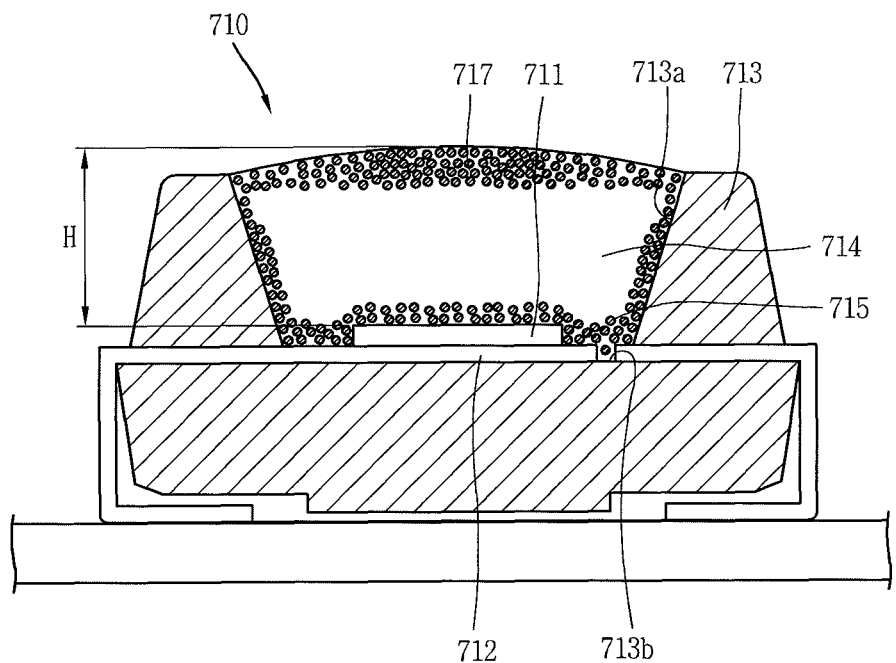
FIGS. 9A and 9B are conceptual views respectively illustrating another embodiment of a light emitting device package according to an embodiment of the present disclosure.
Figure 9B:
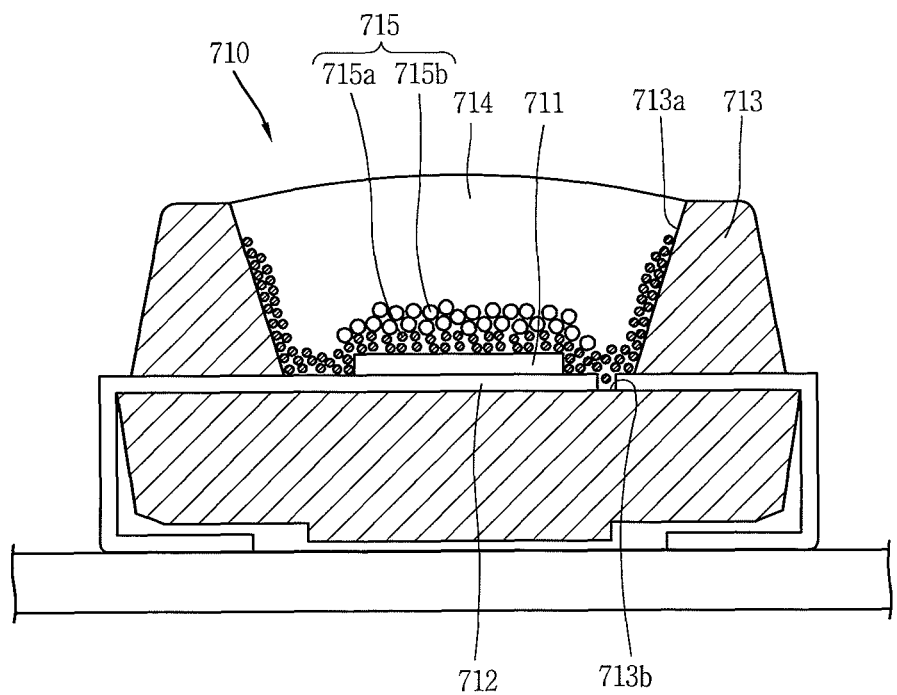

Referring to FIG. 9A, a first layer 715 may be a scattering layer. Accordingly, a scattering agent is provided in the first layer 715, and the foregoing second material is provided in the second layer 717. The second material may be a scattering agent for scattering light or a phosphor for converting a wavelength thereof. More specifically, the second material is disposed adjacent to an interface between the encapsulant and external air space. In other words, the second material is disposed on a second layer 717 including the interface as a boundary. Thus, the second material may be formed of a material with a specific gravity smaller than that of the encapsulant 714.

Furthermore, the second material may be distributed above 60% of the distance (H) from the light emitting device to the interface. The second material 116 is disposed adjacent to an interface between the encapsulant 714 and external air space to scatter at least part of light that has been scattered or a wavelength of which has been converted in the first material. Furthermore, the second material may scatter at least part of light that has been emitted from the light emitting device 711 but not scattered in the scattering layer or convert a wavelength thereof. Thus, the second material floats up to an interface between the encapsulant 714 and external air space to be uniformly distributed on a plane projecting the interface.

A scattering layer including the first layer 715 is formed in a cavity filled with the encapsulant 714, and formed to cover at least part of an inner wall 713a of the body 713 defining the cavity as well as to cover the light emitting device 711. Accordingly, the encapsulant 714 filling into the cavity covers the scattering layer 715. In this instance, the inner wall 713a of the body 713 is a portion surrounding the cavity, wherein a space of the cavity is defined by the inner wall 713a.

As a more specific example, the scattering layer is deposited on a surface of the light emitting device 711, and the encapsulant 714 is deposited on a surface of the scattering layer. Accordingly, the scattering layer is located on an interface between the light emitting device 711 and the encapsulant 714. Through such a structure, a difference between refractive indices on the interface can be reduced compared to when the scattering layer 715 is not provided thereon.

Further, the first layer 715 is extended to an inner wall 713a of the body 713 from a surface of the light emitting device 711 through the bottom 713b of the cavity. For example, a reflection ratio can be increased on the inner wall, thereby providing an effect of enhancing light extraction efficiency in a semiconductor light emitting device package.

Further, the scattering layer may be coated on the inner wall 713a of the body 713 when the light emitting device 711 is disposed on the cavity. The coating may be performed using a spray method. In addition, the scattering layer may be formed on a surface of the light emitting device 711 with a uniform thickness, and formed on the inner wall 713a of the body 713 with a non-uniform thickness. For example, the scattering layer may be configured such that a portion covering the light emitting device 711 is formed with a different thickness from that of at least part of a portion covering the inner wall 713a of the body.

In this instance, the scattering layer may be configured such that a portion covering the light emitting device 711 is formed with a larger thickness than that of at least of a portion covering the inner wall 713a of the body. In another example, the scattering layer may be thinner as being closer to an upper side from the bottom of the cavity. In another example, the scattering layer may be configured with a first thickness for a first section and a second thickness thinner than the first thickness for a second section along the direction of moving from the bottom of the cavity toward the top.

Further, the scattering layer according to the present example may be provided alone in a light emitting device package without a second layer. In this instance, it is possible to reduce a difference between refractive indices on an interface between the light emitting device and the encapsulant. Thus, it is possible to implement a display apparatus having an improved light extraction efficiency as well as with an enhanced light-emitting efficiency.

In another example, as illustrated in FIG. 9B, the first layer 715 may further include a phosphor layer 715b deposited on the scattering layer 715a. The phosphor layer 715b may include any one of a red phosphor, a green phosphor and a yellow phosphor for converting a wavelength of light to change the color. When the phosphor layer 715b includes a yellow phosphor, the semiconductor light emitting device package outputs white light. In another example, when the phosphor layer 715b includes a red phosphor or green phosphor, the semiconductor light emitting device package outputs red or green light.

More specifically, the scattering layer 715a may be disposed between the light emitting device 711 and the phosphor layer 715b, and one surface of the scattering layer 715a may form an interface to the light emitting device 711, and the other surface (an opposite surface to the one surface) of the scattering layer 715a may form an interface to the encapsulant 714. Thus, a phosphor provided on the phosphor layer 715b may be formed of a material with a specific gravity larger than that of the encapsulant 714.

Further, according to the present example, it is possible to have a configuration without having a second layer as illustrated in FIG. 9B. Furthermore, the second layer may be also omitted even in the example described with reference to FIG. 9A. In another example, a quantum dot (QD) composite instead of the phosphor may be mixed with the encapsulant. In other words, the quantum dot composite formed the phosphor layer 715b. In this instance, a surface of the quantum dot composite may be coated for deterioration prevention.

According to the present disclosure having the foregoing configuration, it may be possible to solve a problem that light is confined or absorbed within an encapsulant and then turned into heat to reduce light extraction efficiency since the role of a scattering agent is insufficient when a phosphor is not used or a small amount of phosphor is used in a light emitting device package.

Furthermore, according to the present disclosure, a scattering layer may be formed on an interface between the light emitting device and the light transmitting resin and an interface between the light transmitting resin and the air space as the second material is disposed on a layer different from that of the first material, thereby reducing a total reflection phenomenon. Through this, it may be possible to implement a display apparatus with an enhanced emission efficiency.

In this manner, a highly efficient light source for a high color reproduction backlight unit may be implemented using a light emitting device package with an excellent light extraction efficiency. Furthermore, a combination of a monochromatic semiconductor package and a phosphor may be used for a high color reproduction display apparatus, thereby increasing an emission efficiency of the monochromatic semiconductor package. Through this, it may be expected to improve the brightness and energy efficiency of a display apparatus.

Furthermore, according to the present disclosure, a scattering agent and an encapsulant having different specific gravities may be coated on an encapsulant to generate a scattering layer of multi-layer with a simple fabrication method.

The configurations and methods according to the above-described embodiments will not be applicable in a limited way to the foregoing light emitting device package and fabrication method thereof, and all or part of each embodiment may be selectively combined and configured to make various modifications thereto.

What is claimed is:

1. A display apparatus, comprising:
a backlight unit including a plurality of light emitting device packages configured to emit light; and
a liquid crystal panel configured to display an image using the light emitted by the backlight unit,
wherein the light emitting device packages include:
a light emitting device;
an encapsulant configured to cover the light emitting device;
a first material mixed with the encapsulant to scatter light emitted from the light emitting device or convert a wavelength; and
a second material mixed with the encapsulant, and disposed on a layer different from that of the first material in the encapsulant,
wherein the first and second materials are made of the same material with different sizes or the same material with the same size, the first and second materials are made of the same material and form solid particles and hollow particles, respectively, or the first and the second material are surface-treated to have different properties.

2. The display apparatus of claim 1, wherein the first material is disposed closer to the light emitting device than the second material.

3. The display apparatus of claim 2, wherein the first material is disposed adjacent to the light emitting device, and the second material is disposed adjacent to an interface between the encapsulant and an external air space.

4. The display apparatus of claim 3, wherein the first material is distributed under 15% of a distance from the light emitting device to the interface, and the second material is distributed above 60% of the distance from the light emitting device to the interface.

5. The display apparatus of claim 2, wherein the encapsulant comprises a light transmitting resin covering the light emitting device, and
wherein an intermediate layer including only the light transmitting resin is disposed between the first material and the second material.

6. The display apparatus of claim 1, wherein the first and the second material have different specific gravities in the encapsulant.

7. The display apparatus of claim 6, wherein the encapsulant comprises a light transmitting resin covering the light emitting device, and
wherein the first material has a specific gravity larger than that of the light transmitting resin, and the second material has a specific gravity smaller than that of the light transmitting resin.

8. The display apparatus of claim 1, wherein the first material is coated with a coagulant to cohere with one another, and the second material is coated with a dispersant to disperse from one another.

9. The display apparatus of claim 1, wherein the encapsulant comprises a first light transmitting resin in which either one of the first and the second material is disposed and a second light transmitting resin in which the other one of the first and the second material is disposed.

10. The display apparatus of claim 9, wherein the first light transmitting resin is formed to cover the light emitting device, and the second light transmitting resin is formed to cover the first light transmitting resin.

11. The display apparatus of claim 1, wherein the second material is distributed in a larger area than the first material.

12. The display apparatus of claim 11, wherein the first material is formed to overlap with an area of above 90% of the light emitting device, and the second material is formed to completely overlap with an area of the light emitting device.

13. The display apparatus of claim 1, wherein the light emitting device is formed to emit blue light, and the first and the second material comprise scattering agents.

14. The display apparatus of claim 1, wherein the light emitting device is formed to emit blue light, and the first and the second material comprise at least one of yellow, red and green phosphors, respectively.

15. The display apparatus of claim 1, wherein the first material forms a scattering layer covering an inner wall of the body for defining the cavity of the light emitting device along with the light emitting device.

16. The display apparatus of claim 15, wherein the scattering layer extends from a surface of the light emitting device to at least part of the inner wall of the body through the bottom of the cavity.

17. A method of fabricating a light emitting device package, the method comprising:
- mixing a first and a second material having different specific gravities in an encapsulant;
- coating an encapsulant mixed with the first and the second material to cover a light emitting device; and
- placing the first and the second material on different layers caused by the different specific gravities,
- wherein the first and second materials are made of the same material with different sizes or the same material with the same size, the first and second materials are made of the same material and form solid particles and hollow particles, respectively, or the first and the second material are surface-treated to have different properties.

18. A light emitting device package, comprising:
- a light emitting device;
- an encapsulant configured to cover the light emitting device;
- a first material mixed with the encapsulant to scatter light emitted from the light emitting device or convert a wavelength; and
- a second material mixed with the encapsulant, and disposed on a layer different from that of the first material in the encapsulant to scatter or wavelength-convert at least part of light scattered and wavelength-converted from the first material,
- wherein the first and second materials are made of the same material with different sizes or the same material with the same size, the first and second materials are made of the same material and form solid particles and hollow particles, respectively, or the first and the second material are surface-treated to have different properties.

* * * * *